United States Patent
Ogasawara et al.

(10) Patent No.: US 8,815,106 B2
(45) Date of Patent: Aug. 26, 2014

(54) METHOD OF SUPPLYING ETCHING GAS AND ETCHING APPARATUS

(75) Inventors: Masahiro Ogasawara, Nirasaki (JP); Yoshiyuki Kato, Nirasaki (JP); Hideki Mizuno, Nirasaki (JP); Yoshinobu Hayakawa, Nirasaki (JP)

(73) Assignee: Tokyo Electron Limited (JP)

( * ) Notice: Subject to any disclaimer, the term of this patent is extended or adjusted under 35 U.S.C. 154(b) by 236 days.

(21) Appl. No.: 13/206,875

(22) Filed: Aug. 10, 2011

(65) Prior Publication Data

US 2012/0037316 A1 Feb. 16, 2012

Related U.S. Application Data

(60) Provisional application No. 61/377,490, filed on Aug. 27, 2010.

(30) Foreign Application Priority Data

Aug. 12, 2010 (JP) ................. 2010-180721

(51) Int. Cl.
- B44C 1/22 (2006.01)
- H01L 21/3065 (2006.01)
- H01J 37/32 (2006.01)

(52) U.S. Cl.
CPC ..... *H01L 21/30655* (2013.01); *H01J 37/32091* (2013.01); *H01J 37/32449* (2013.01); *H01J 2237/3341* (2013.01)
USPC ........................................ 216/58; 156/345.1

(58) Field of Classification Search
CPC .............. H01J 37/32449; H01J 2237/334; H01J 2237/3341; H01J 37/3244; H01J 37/32091; H01L 21/30655; C03B 25/14; C23C 16/45561

USPC ............ 216/37, 58, 59, 67, 46; 438/935, 695, 438/714, 694, 909, 700, 703, 706, 9, 696, 438/710, 5; 156/345.26, 345.1, 345.24, 156/345.29, 345.33; 118/715; 427/96.8, 427/255.23, 255.28, 255.7

See application file for complete search history.

(56) References Cited

U.S. PATENT DOCUMENTS

| 5,451,290 | A * | 9/1995 | Salfelder ................. 216/67 |
| 7,030,027 | B1 * | 4/2006 | Suzuki ................. 438/710 |
| 7,153,779 | B2 * | 12/2006 | Trapp ................. 438/706 |
| 2001/0002581 | A1 * | 6/2001 | Nishikawa et al. ...... 118/715 |
| 2003/0162395 | A1 * | 8/2003 | Trapp ................. 438/689 |
| 2004/0180544 | A1 | 9/2004 | Kasai et al. |

(Continued)

FOREIGN PATENT DOCUMENTS

| CN | 101416284 | 4/2009 |
| JP | 11-195641 | 7/1999 |

(Continued)

*Primary Examiner* — Binh X Tran
*Assistant Examiner* — David Cathey, Jr.
(74) *Attorney, Agent, or Firm* — Cantor Colburn LLP

(57) ABSTRACT

A method of supplying an etching gas includes: supplying a first etching gas used in an etching process into a processing container; and supplying a second etching gas used in the etching process into the processing container, in which, when the first etching gas and the second etching gas are switched therebetween, only a small amount of a gas, which is needed as an etching gas before the switching and is not needed as an etching gas after the switching, is continuously supplied into the processing container.

8 Claims, 5 Drawing Sheets

(56) References Cited

U.S. PATENT DOCUMENTS

2005/0103748 A1* 5/2005 Yamaguchi et al. ............ 216/67
2005/0106891 A1* 5/2005 Polinsky et al. .............. 438/729
2005/0269294 A1* 12/2005 Igarashi et al. ................ 216/67
2012/0061350 A1* 3/2012 Dhindsa .......................... 216/59

FOREIGN PATENT DOCUMENTS

| JP | 2000-306887 | 11/2000 |
| JP | 2001127049 | 5/2001 |
| WO | 03030239 | 4/2003 |

* cited by examiner

METHOD OF SUPPLYING ETCHING GAS AND ETCHING APPARATUS

CROSS-REFERENCE TO RELATED PATENT APPLICATIONS

This application claims the benefit of Japanese Patent Application No. 2010-180721, filed on Aug. 12, 2010, in the Japan Patent Office, and U.S. Patent Application No. 61/377,490, filed Aug. 27, 2010, in the United States Patent and Trademark Office, the disclosures of which are incorporated herein in their entireties by reference.

BACKGROUND OF THE INVENTION

1. Field of the Invention

The present invention relates to a method of supplying an etching gas and an etching apparatus.

2. Description of the Related Art

In general, in a gas supply system for a semiconductor manufacturing apparatus, a plurality of gases are output from a gas box provided outside the apparatus, are joined together in one common pipe (manifold) through a plurality of individual gas supply lines, and are guided into a processing container of the semiconductor manufacturing apparatus.

When gas species are switched in the same apparatus, attempts have been made to prevent the switching from adversely affecting processes before and after the switching. For example, an attempt to perform a stable step for about 5 seconds before performing a process after switching has been suggested. By performing the stable step, stability of the process after the switching can be achieved. Also, accordingly, since hunting (overshoot) in a gas flow rate which occurs at an initial stage when a valve of a mass flow controller (MFC) is controlled to change from a closed state to an opened state occurs in the stable step, the hunting is prevented from adversely affecting the process after the switching.

Patent Document 1 and Patent Document 2 disclose technologies of controlling gases when an etching process and a film formation process are switched therebetween. For example, Patent Document 1 involves providing a transition process including both an etching gas and a deposition gas while the etching gas and the deposition gas are switched therebetween and thus reducing discontinuity of gas species during the switching. Patent Document 2 involves, when the etching gas and the deposition gas are switched therebetween, controlling flow rates of an etching gas and a deposition gas by using MFCs respectively attached to gas supply lines, further controlling a total flow rate of a gas mixture of the etching gas and the deposition gas by using an MFC attached to a common pipe, and supplying the gas mixture into a processing container.

However, Patent Documents 1 and 2 fail to disclose a method of supplying a gas, where a flow rate of a gas is stably controlled by preventing hunting in a gas flow rate which occurs when a gas is switched.

[Patent Document 1] Japanese Laid-Open Patent Publication No. Hei 11-195641

[Patent Document 2] Japanese Laid-Open Patent Publication No. 2000-306887

SUMMARY OF THE INVENTION

To solve the above and/or other problems, the present invention provides a method of supplying an etching gas and an etching apparatus, which can stably control a flow rate of a gas by preventing hunting in a gas flow rate which occurs when a gas is switched, by using a simple method.

According to one aspect of the present invention, there is provided a method of supplying an etching gas, the method including: supplying a first etching gas used in an etching process into a processing container; and supplying a second etching gas used in the etching process into the processing container, wherein when the first etching gas and the second etching gas are switched therebetween, only a small amount of a gas, which is needed as an etching gas before the switching and is not needed as an etching gas after the switching, is continuously supplied into the processing container.

In this configuration, when a gas is switched, only a small amount of a gas, which is needed as an etching gas before the switching and is not needed as an etching gas after the switching, is continuously supplied. Accordingly, since hunting in a gas flow rate which occurs when a valve of a mass flow controller changes from a closed state to an opened state can be prevented, the hunting can be prevented from adversely affecting an etching process after the switching. Also, in this configuration, since a valve for switching or a pipe for switching is not required, a flow rate of a gas can be stably controlled by using a simple method using an existing device.

Flow rates of the first etching gas and the second etching gas may be controlled by a gas flow rate control device, wherein the small amount is controlled to be 1% to 3% of a maximum flow rate that the gas flow rate control device is capable of controlling.

Flow rates of the first etching gas and the second etching gas may be controlled by a gas flow rate control device, wherein the small amount is controlled to be a small amount equal to or greater than a minimum flow rate that the gas flow rate control device is capable of controlling.

When there exist a plurality of gases which are included in etching gases before the switching and are not included in etching gases after the switching, a small amount of each of the plurality of gases may be continuously supplied.

The first etching gas and the second etching gas may flow through a plurality of individual gas supply lines that are respectively provided according to gas species, may be joined together in a common pipe connected to the plurality of individual gas supply lines, and may be supplied into the processing container.

The first etching gas and the second etching gas may be alternately and repeatedly switched therebetween, wherein, whenever the first etching gas and the second etching gas are switched therebetween, a small amount of an etching gas which is needed in a process before the switching and is not needed in a process after the switching is supplied.

One of the first etching gas and the second etching gas may have a deposition property stronger than a deposition property of the other.

According to another aspect of the present invention, there is provided an etching apparatus including: a processing container; a susceptor on which an object to be processed is held in the processing container; a gas supply source which supplies gases; and a gas flow rate control device which controls flow rates of the gases, wherein the object to be processed is plasma-etched by exciting the gases in the processing container, wherein the gas supply source supplies a first etching gas and a second etching gas used in an etching process into the processing container, wherein, when the first etching gas and the second etching gas are switched therebetween, the gas flow rate control device controls a gas flow rate such that only a small amount of a gas, which is needed as an etching gas before the switching and is not needed as an etching gas after the switching, is continuously supplied into the processing container.

BRIEF DESCRIPTION OF THE DRAWINGS

The above and other features and advantages of the present invention will become more apparent by describing in detail exemplary embodiments thereof with reference to the attached drawings in which.

Figure 1:
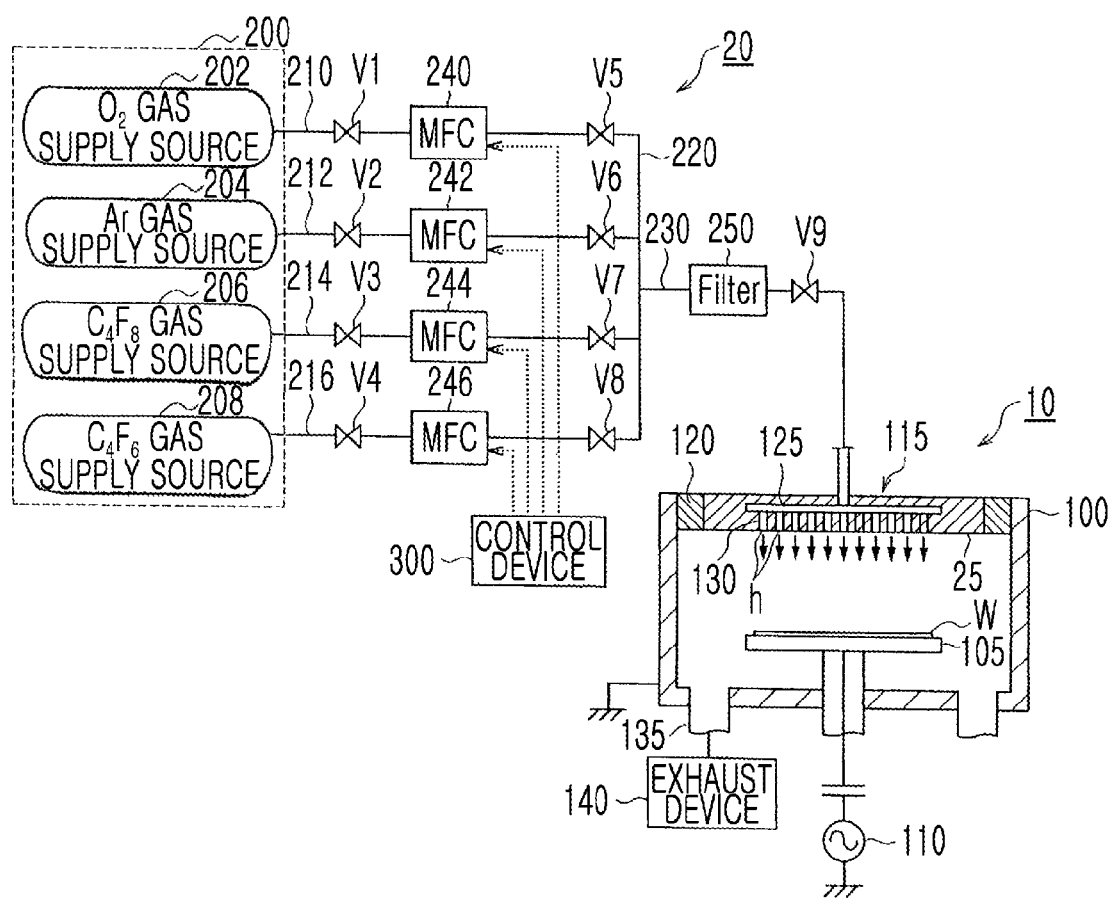
FIG. 1 is a longitudinal-sectional view schematically showing an etching apparatus according to an embodiment of the present invention.

DETAILED DESCRIPTION OF THE INVENTION (Embodiment for Carrying Out the Invention)

An embodiment of the present invention will now be explained in detail with reference to the attached drawings. Also, in the specification and the drawings, elements having substantially the same functions and configurations are denoted by the same reference numerals, and a repeated explanation thereof will not be given.

(Etching Apparatus and Gas Supply System)

First, an overall configuration of an etching apparatus according to an embodiment of the present invention will be explained with reference to FIG. 1. FIG. 1 is a longitudinal-sectional view schematically showing an etching apparatus according to an embodiment of the present invention.

The etching apparatus 10 includes a processing container 100 in which a wafer W is etched. A gas supply system 20 is provided outside the processing container 100. The gas supply system 20 includes a gas box 200, a plurality of individual gas supply lines 210, 212, 214, and 216, a common pipe (manifold) 220, and a gas mixture supply line 230. An $O_2$ gas supply source 202, an Ar gas supply source 204, a $C_4F_8$ gas supply source 206, and a $C_4F_6$ gas supply source 208 are provided as gas supply sources in the gas box 200, and are connected in a one-to-one manner to the individual gas supply lines 210, 212, 214, and 216 at upstream sides of the individual gas supply lines 210, 212, 214, and 216. Downstream sides of the individual gas supply lines 210, 212, 214, and 216 are connected to the one common pipe 220. With this configuration, an $O_2$ gas, an Ar gas, a $C_4F_8$ gas, and a $C_4F_6$ gas respectively output from the gas supply sources flow through the individual gas supply lines 210, 212, 214, and 216 and are joined together in the common pipe 220.

Mass flow controllers (MFCs) 240, 242, 244, and 246 for controlling flow rates of the gases, and valves V1 through V4 disposed before the MFCs and valves V5 through V8 disposed after the MFCs in order to open and close the individual gas supply lines are provided in the individual gas supply lines 210, 212, 214, and 216.

A downstream side of the common pipe 220 is connected to the gas mixture supply line 230. The gas mixture supply line 230 is connected to the processing container 100 in which etching is performed. A filter 250 in order to remove particles in a gas mixture and a valve V9 are provided in the gas mixture supply line 230.

The processing container 100 is a chamber having a substantially cylindrical shape formed of, for example, aluminum whose surface is anodized. The processing container 100 is grounded. A susceptor 105 formed of, for example, aluminum is provided in a bottom portion of the processing container 100. The susceptor 105 constitutes a lower electrode, and the semiconductor wafer W, that is, an object to be processed, is held on the susceptor 105. The etching apparatus 10 is a capacity-coupled parallel plate plasma etching apparatus in which the susceptor 105 and an upper electrode 115 face each other. A high frequency power source 110 is provided outside the etching apparatus 10, and high frequency (RF) power having a frequency of 27 MHz or above for generating plasma, for example, 40 MHz, is applied to the susceptor 105 from the high frequency power source 110.

The upper electrode 115 is supported at an upper portion of the processing container 100 with an insulating shielding member 120 therebetween. The upper electrode 115 has a plurality of ejection holes 'h' formed therein. A gas diffusion chamber 125 is provided in the upper electrode 115, and a plurality of gas communication holes 130 communicating with the gas ejection holes "h" extend downward from the gas diffusion chamber 125. With this configuration, the upper electrode 115 serves as a gas shower head for supplying a desired gas, and a gas mixture having been flowed through the gas mixture supply line 230 is introduced into the processing container 100 through the gas shower head formed in the upper electrode 115.

An exhaust port 135 is provided in a bottom portion of the processing container 100, and an exhaust device 140 is connected through an exhaust pipe to the exhaust port 135. Since the exhaust device 140 includes a vacuum pump such as a turbomolecular pump or the like, the exhaust device 140 can depressurize an inside of the processing container 100 to a desired vacuum level.

A control device 300 controls a gas or high frequency power to be supplied according to a recipe describing an order in which etching processes are performed, in order to perform plasma etching in the processing container 100 of the etching apparatus 10. The recipe may be stored in a hard disc or a semiconductor memory (not shown), or may be stored in a readable storage medium such as a CDROM, a DVD, or the like.

In the etching apparatus 10 configured as described above, in the present embodiment, etching is performed by alternately switching different gases for a short period of time during plasma etching. For example, in the present embodiment, etching is performed under a first process condition, in which an etching gas of $C_4F_6$ having a strong deposition property is used, and etching is performed under a second process condition, in which an etching gas of $C_4F_8$ having a weaker deposition property than that of the gas used in the first process condition is used. A deep hole having a high aspect ratio can be formed by continuously, repeatedly, and alternately performing the etchings under the first and second process conditions. Also, since the etchings are continuously performed while alternately switching between a gas having a strong deposition property and a gas having a weak deposition property, high frequency power can be continuously applied during the etchings, thereby improving productivity.

In this case, the control device 300 controls flow rates of the depositive etching gas $C_4F_6$ and the non-depositive etching gas $C_4F_8$. That is, the control device 300 outputs flow rate control signals to the MFCs 240, 242, 244, and 246 when process conditions are switched. The MFCs 240, 242, 244, and 246 controls flow rates of gases to be desired values by controlling opening degrees of valve bodies of the MFCs 240, 242, 244, and 246 based on the flow rate control signals. A method of supplying an etching gas at a controlled flow rate will be explained below.

(Method of Supplying Etching Gas)

A conventional method of supplying an etching gas and a method of supplying an etching gas according to the present embodiment of the present invention will be explained through comparison with reference to FIGS. 2 through 5.

(Conventional Method of Supplying Etching Gas)

As described above, generally, in the gas supply system 20 for the etching apparatus 10, the gas supply sources 202, 204, 206, and 208 are respectively connected in a one-to-one manner to the individual gas supply lines 210, 212, 214, and 216, and the individual gas supply lines 210, 212, 214, and 216 are connected to the one common pipe 220. With this configuration, a plurality of types of gases flow respectively through the individual gas supply lines 210, 212, 214, and 216, are joined together in the common pipe 220, and are guided into the processing container of the etching apparatus 10 through the gas mixture supply line 230.

Conventionally, when gas species are switched in the same apparatus, a valve of an MFC for controlling a flow rate of a gas is controlled to change from a closed state to an opened state. In this case, a gas gathered in a gas pipe flows all at once when the valve is opened and then control of a flow rate is started. As a result, at an initial stage when the valve of the MFC is controlled to change from the closed state to the opened state, hunting (overshoot) in a gas flow rate occurs. For example, A of FIG. 2 and B of FIG. 3 show huntings in gas flow rates which occur at an initial stage when first and second processes are switched therebetween.

Figure 2:
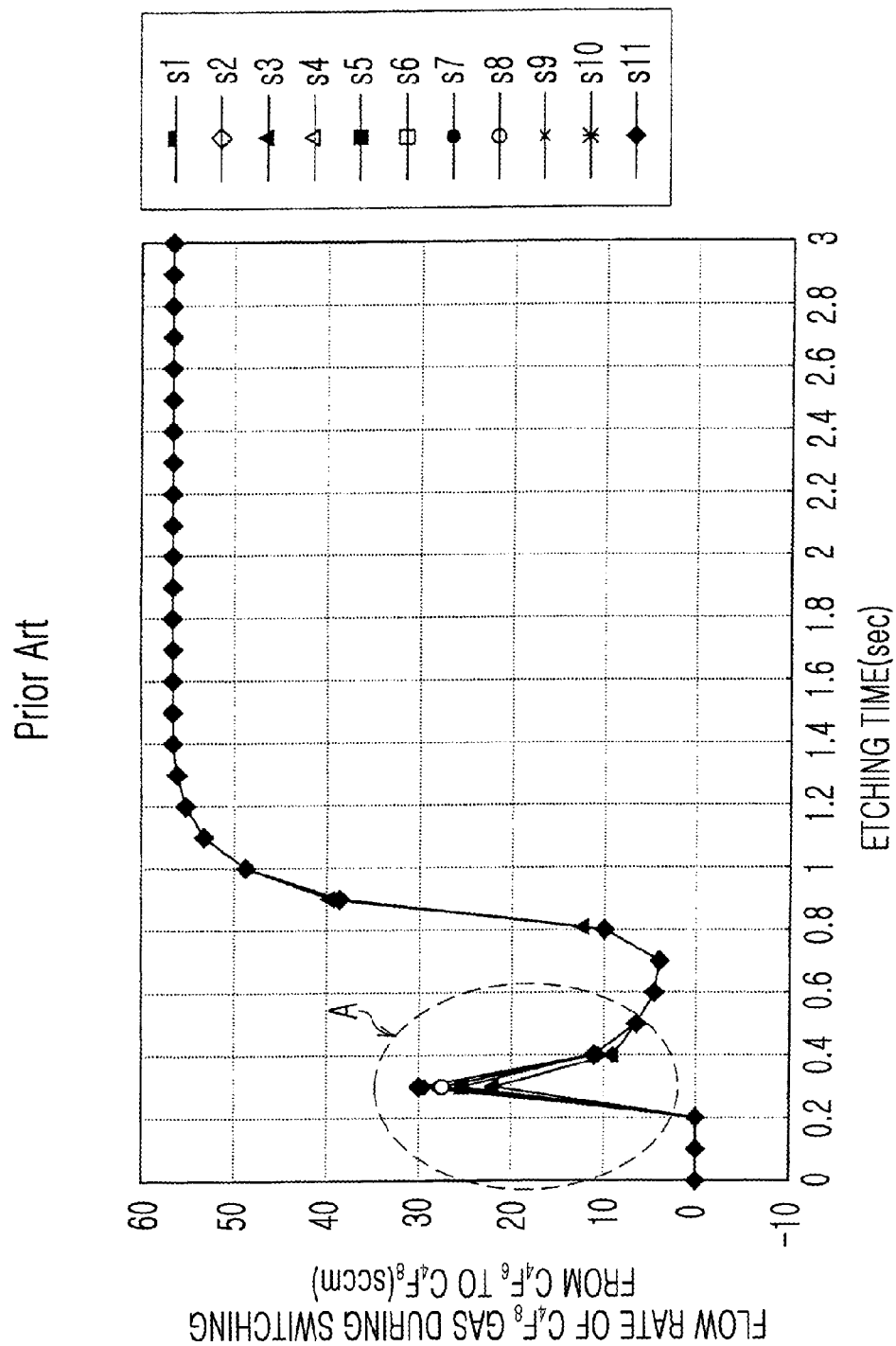
FIG. 2 is a graph showing a flow rate of a $C_4F_8$ gas when a $C_4F_6$ gas is switched to the $C_4F_8$ gas.
Figure 3:
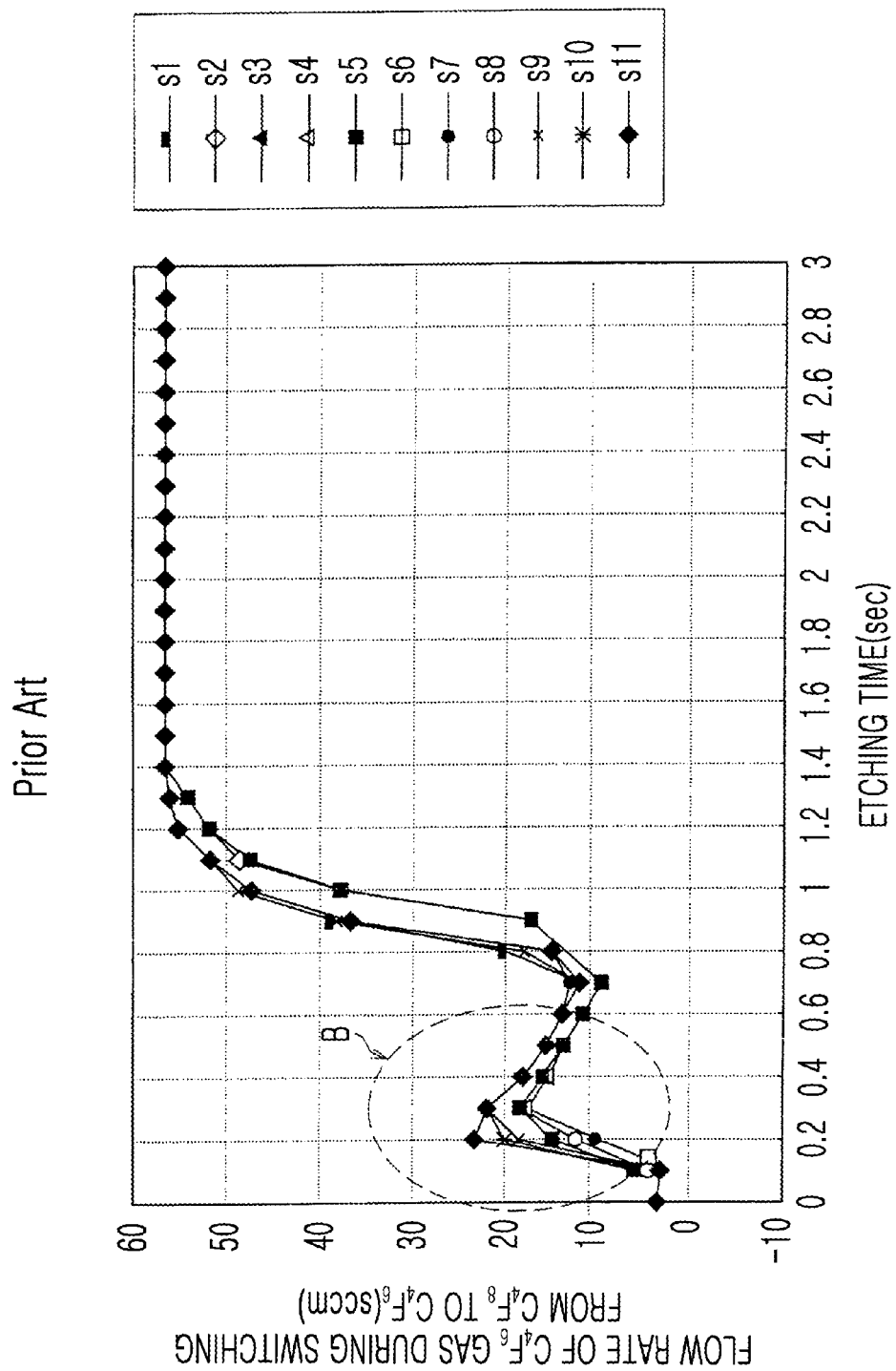
FIG. 3 is a graph showing a flow rate of a $C_4F_6$ gas when a $C_4F_8$ gas is switched to the $C_4F_6$ gas.

Process conditions for deriving results of FIGS. 2 and 3 are as follows.

First Process Condition
Pressure 40 mTorr
Gas species and Flow Rates $C_4F_8/C_4F_6/Ar/O_2$=0/57/500/20 sccm
Etching Time 10 seconds
Second Process Condition
Pressure 40 mTorr
Gas species and Flow Rates $C_4F_8/C_4F_6/Ar/O_2$=57/0/500/40 sccm
Etching Time 10 seconds During plasma etching, a process condition is switched between the first and second process conditions so that gases were switched. FIG. 2 is a graph showing a flow rate of a $C_4F_8$ gas when a $C_4F_6$ gas is switched to the $C_4F_8$ gas. It is found from the graph of FIG. 2 that hunting A in a gas flow rate occurs at an initial stage when the first process condition in which $C_4F_8/C_4F_6$=0/57 (sccm) are supplied is switched to the second process condition in which $C_4F_8/C_4F_6$=57/0 (sccm) are supplied.

Also, FIG. 3 is a graph showing a flow rate of a $C_4F_6$ gas when a $C_4F_8$ gas is switched to the $C_4F_6$ gas. It is found from FIG. 3 that hunting B in a gas flow rate occurs at an initial stage when the second process condition in which $C_4F_8/C_4F_6$=57/0 (sccm) are supplied is switched to the first process condition in which $C_4F_8/C_4F_6$=0/57 (sccm) are supplied.

Also, FIGS. 2 and 3 show changes in gas flow rates when gases are switched for 11 wafers s1 through s11. As a result, it is found that huntings A and B in gas flow rates occur almost without irregularity for all of the wafers, at an initial stage when gases are switched. As a result, it is found that, when etching is performed by alternately switching between the first and second process conditions, overshoot occurs in a 2-step waveform of a gas flow rate at an initial stage of the switching.

(Method of Supplying Etching Gas According to Present Embodiment)

Next, a method of supplying an etching gas according to the present embodiment of the present invention will be explained. In the present embodiment, a method of supplying an etching gas which can stably control a flow rate of a gas by preventing hunting in a gas flow rate which occurs when a gas is switched, by using a simple method, is suggested.

In the method of supplying an etching gas according to the present embodiment, when a $C_4F_6$ gas and a $C_4F_8$ gas in the first and second process conditions are switched therebetween, only a small amount of a gas, which is needed as an etching gas before the switching and is not needed as an etching gas after the switching, is continuously supplied.

That is, in the present embodiment, gas flow rates in the first process condition are $C_4F_8/C_4F_6/Ar/O_2$=3/57/500/20 sccm, and gas flow rates in the second process condition are $C_4F_8/C_4F_6/Ar/O_2$=57/3/500/40 sccm. When a process condition is switched from the first process condition to the second process condition so that a gas is switched, only 3 sccm of the etching gas of $C_4F_6$, which is originally not needed as an etching gas after the switching, is continuously supplied after the switching. By contrast, when a process condition is switched from the second process condition to the first process condition so that a gas is switch, only 3 sccm of the etching gas of $C_4F_8$, which is originally not needed as an etching gas after the switching, is continuously supplied after the switching.

In this case, the control device 300 outputs a flow rate control signal to the MFC 244 or the MFC 246 to continuously supply a small amount of a gas which is about 1% to 3% of a maximum flow rate of the MFC 244 or the MFC 246 by not fully closing a valve of the MFC 244 or the MFC 246. For example, when a maximum flow rate of an MFC is 100 sccm, the control device 300 outputs a flow rate control signal to the MFC to supply 1 to 3 sccm of a gas, that is, 1% to 3% of the maximum flow rate of the MFC.

Figure 4:
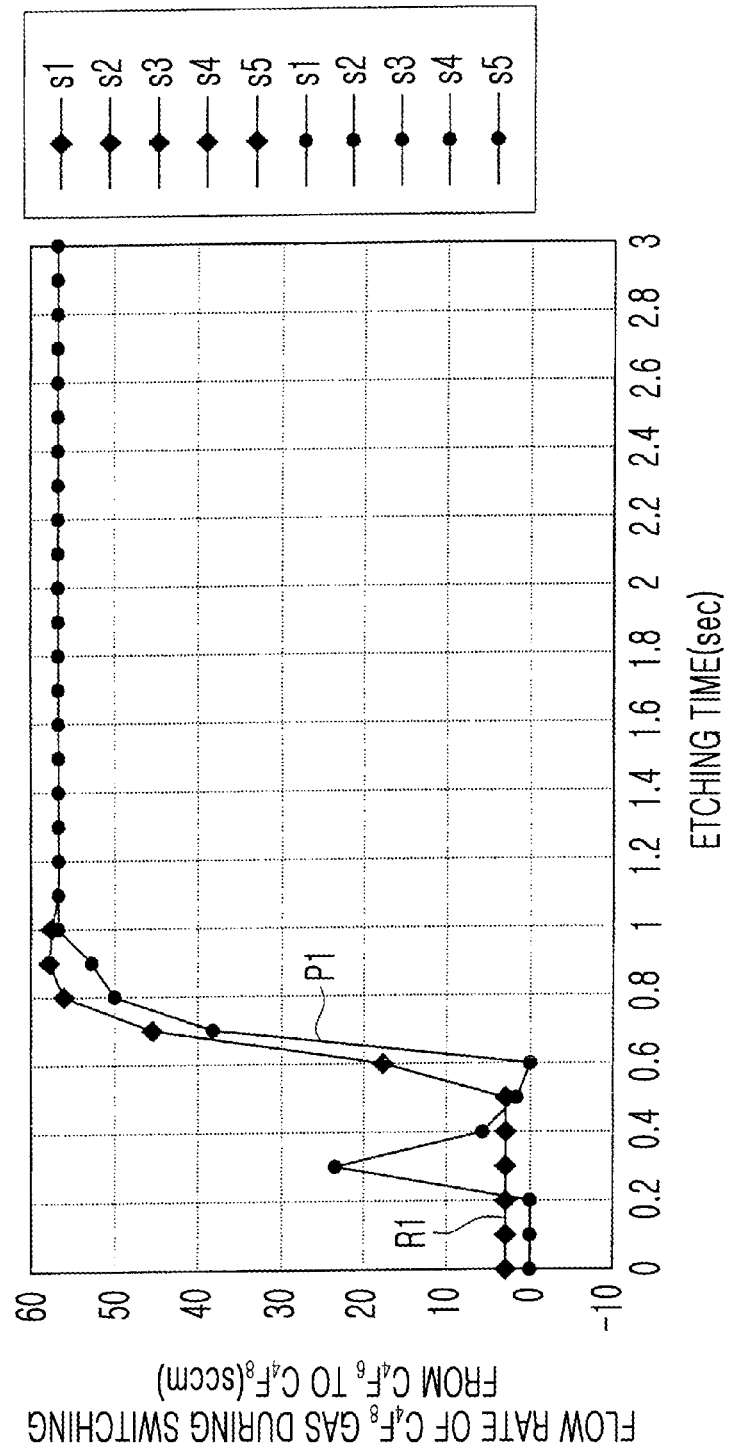
FIG. 4 is a graph showing a flow rate of a $C_4F_8$ gas in a case where, when a $C_4F_6$ gas is switched to the $C_4F_8$ gas, a small amount of the $C_4F_6$ gas is continuously supplied.
Figure 5:
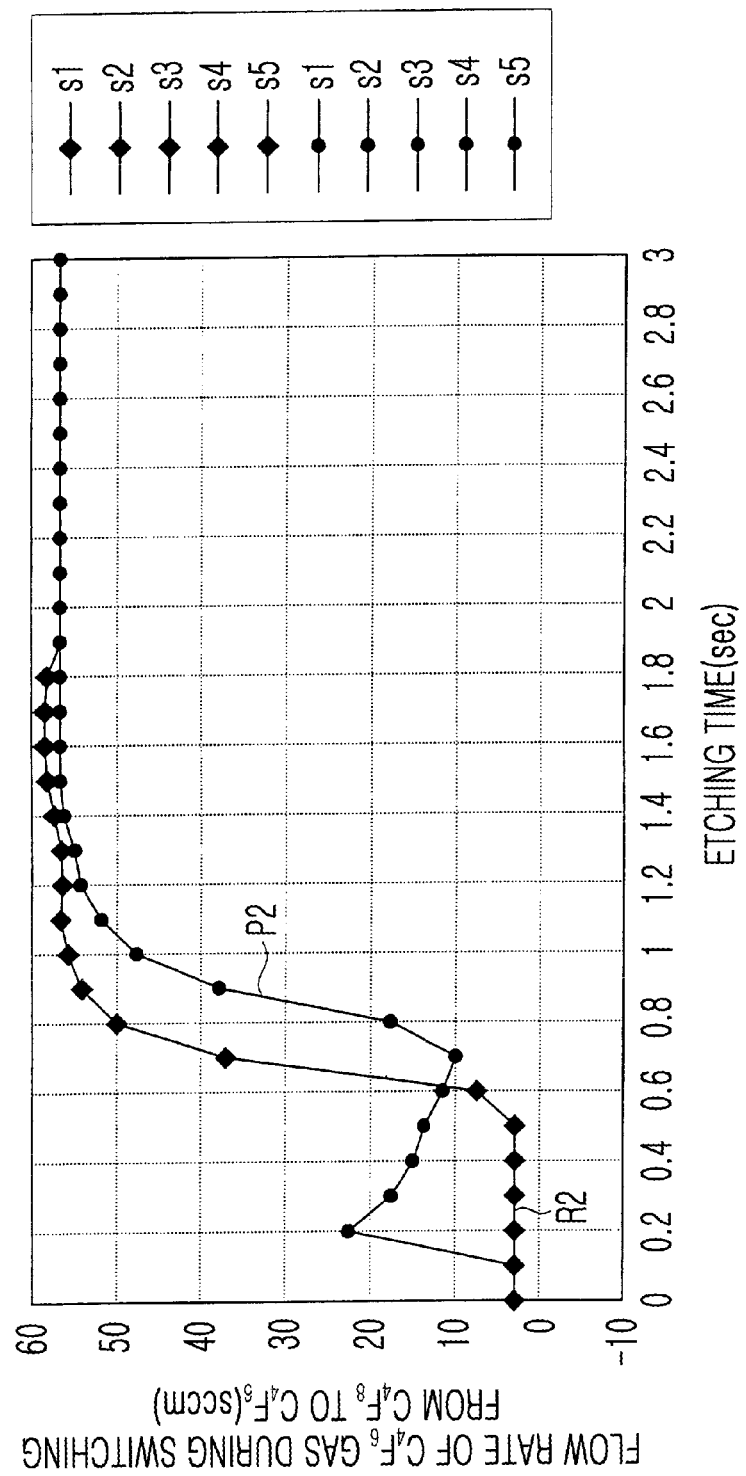
FIG. 5 is a graph showing a flow rate of a $C_4F_6$ gas flow rate in a case where, when a $C_4F_8$ gas is switched to the $C_4F_6$ gas, a small amount of the $C_4F_8$ gas is continuously supplied.

Results thereof are shown in FIGS. 4 and 5. A graph R1 of FIG. 4 shows a transition in a flow rate of a $C_4F_8$ gas in a case where, when a $C_4F_6$ gas is switched to the $C_4F_8$ gas, only 3 sccm of the $C_4F_6$ gas, which is not needed as an etching gas after the switching, is continuously supplied. That is, the graph R1 of FIG. 4 shows a transition in a flow rate of the $C_4F_8$ gas when a first process in which $C_4F_6$=57 (sccm) is supplied is switched to a second process in which $C_4F_6$=3 (sccm) and $C_4F_8$=57 (sccm) are supplied. It is found that no hunting occurs, compared to a graph P1 of FIG. 4 showing a case where the $C_4F_6$ gas, which is not needed as an etching gas after the switching, is not supplied. It is found from this experiment that hunting which may occur at an initial stage of switching can be prevented by continuously supplying only a small amount of the $C_4F_6$ gas, which is not needed as an etching gas after the switching.

A graph R2 of FIG. 5 shows a transition in a gas flow rate in a case where, when a $C_4F_8$ gas is switched to a $C_4F_6$ gas, only 3 sccm of the $C_4F_8$ gas, which is not needed as an etching gas after the switching, is continuously supplied. That is, the graph R2 of FIG. 5 shows a transition in a flow rate of the $C_4F_6$ gas when a second process in which $C_4F_8$=57 (sccm) is supplied is switched to a first process in which $C_4F_6$=57 (sccm) and $C_4F_8$=3 (sccm) are supplied. It is found that no hunting occurs, compared to a graph P2 of FIG. 5 showing a case where the $C_4F_8$ gas, which is not needed as an etching gas after the switching, is not supplied. It is found from this experiment that hunting which may occur at an initial stage of switching can be prevented by continuously supplying only a small amount of the $C_4F_8$ gas, which is not needed as an etching gas after the switching.

Also, the graphs P1 and R1 shown in FIG. 4 and the graphs P2 and R2 shown in FIG. 5 show average values for 5 wafers in transitions of gas flow rates which occur during gas switching, wherein all of the 5 wafers have the same behavior. It is found from the result that, when a first etching gas and a second etching gas are switched therebetween, hunting in a gas flow rate which occurs at an initial stage of the switching can be prevented by continuously supplying only a small amount of a gas which is needed as an etching gas before the switching and is originally not needed as an etching gas after the switching. This seems to be because a gas gathered in a gas pipe can be prevented from flowing all at once when a valve is opened by not fully closing but slightly opening a valve body of an MFC. As a result, since the hunting is prevented from adversely affecting a process after the switching, a deep hole having a high aspect ratio can be formed.

A peak of hunting which occurs during gas switching varies according to a length of a gas pipe from the gas box 200 to the processing container 100 and an amount of the gas affected by a pressure of a gas gathered in the pipe, a temperature difference, and so on. Accordingly, since an effect of hunting on a process after switching according to a peak difference varies according to the length of the gas pipe or an amount of the gas gathered in the pipe, it is difficult to equally offset (correct) the effect. However, according to the method of supplying an etching gas according to the present embodiment, since hunting in a gas flow rate which occurs during switching can be prevented, as a result, an effect of a hunting difference according to the length of the gas pipe and the amount of the gas gathered in the pipe can be offset (corrected).

Also, according to the method of supplying an etching gas according to the present embodiment, since an additional valve for switching or an additional pipe for switching does not need to be provided in the gas supply system 20, a flow rate of a gas can be stably controlled by using a simple method using an existing device.

Also, since first and second processes are alternately, continuously, and repeatedly performed, high frequency power does not need to be shut off during etching including the first and second processes. Also, a stable step does not need to be provided during gas switching. Also, an actual process does not need to be temporarily stopped for the stable step. As a result, since a gas supplied in the stable step is not exhausted unnecessarily and only a minimum amount of an F-based gas is exhausted, it is good for the environment and resources can be effectively used. Also, since the stable step is not required, throughput can be improved, thereby improving productivity.

Also, although a small amount is controlled to be 1% to 3% of a maximum flow rate that an MFC can control in the present embodiment, the small amount may be any, as long as it is equal to or greater than a minimum flow rate that the MFC can control and it is small. For example, if the minimum flow rate that the MFC can surely control is 2% to 3% of the maximum flow rate that the MFC can control, the small amount may be controlled to be 2% to 3% of the maximum flow rate that the MFC can control.

Also, an effect of a feature in which a small amount of an unnecessary etching gas is continuously supplied in an etching process after switching may be offset by tuning a process condition after the switching such that a result of etching obtained when the unnecessary etching gas is continuously supplied is equal to a result of etching obtained when the unnecessary etching gas is not supplied.

As described above, according to the present invention, a gas flow rate can be stably controlled by preventing hunting in a gas flow rate which occurs when a gas is switched, by using a simple method.

While the present invention has been particularly shown and described with reference to exemplary embodiments thereof, the present invention is not limited to these embodiments. It will be understood by those of ordinary skill in the art that various changes in form and details may be made therein without departing from the spirit and scope of the present invention as defined by the following claims.

For example, although a gas flow rate is controlled by using an MFC in the above embodiment, a gas flow rate control device according to the present invention is not limited thereto, and may be a flow control system (FCS) (registered trademark).

Also, it has been explained in the above embodiment that in an etching process including a step of supplying a first etching gas (a $C_4F_6$ gas) which is a depositive gas used in an etching process and a step of supplying a second etching gas (a $C_4F_8$ gas) which is a non-depositive gas used in the etching process, there exists only one gas which is included in the etching gas before switching and is not included in the etching gas after switching (that is, the $C_4F_6$ gas when the first etching gas is switched to the second etching gas and the $C_4F_8$ gas when the second etching gas is switched to the first etching gas). However, the method of supplying an etching gas according to the present invention is not limited thereto and may be applied even when a plurality of gases are included in etching gases before switching and are not included in etching gases after the switching, by continuously supplying only small amounts of the plurality of gases.

Also, in the above embodiment, two process conditions under which a step of supplying the first etching gas and a step of supplying the second etching gas are switched therebetween have been described. However, the method of supplying an etching gas according to the present invention is not limited thereto, and may be applied even when three or more process conditions are switched therebetween, by continuously supplying only small amounts of etching gases which are needed before etching and are not needed after the etching in the same manner.

Also, in the method of supplying an etching gas according to the present invention, only a small amount of a gas, which is not needed as an etching gas after switching, may be continuously supplied until the switching ends in a predetermined period of time after the switching starts, and more preferably, may be continuously supplied until next switching occurs.

The etching apparatus according to the present invention is not limited to a parallel plate plasma processing apparatus as long as it is a plasma processing apparatus, and may be another plasma processing apparatus such as an inductively coupled plasma (ICP) processing apparatus or the like.

What is claimed is:

1. A method of supplying an etching gas, the method comprising:
   supplying a first etching gas used in an etching process into a processing container; and
   supplying a second etching gas used in the etching process into the processing container,
   wherein, in a first switching where the first etching gas is switched to the second etching gas a first predetermined amount of a first common gas, which is needed as an etching gas in a process before the first switching and is not needed as an etching gas in a process after the first switching, is continuously supplied into the processing container, and in a second switching where the second etching gas is switched to the first etching gas, a second predetermined amount of a second common gas, which is needed as an etching gas in a process before the second switching and is not needed as an etching gas in a process after the second switching, is continuously supplied into the processing container.

2. The method of claim 1, wherein flow rates of the first etching gas and the second etching gas are controlled by a gas flow rate control device, and each of the first predetermined amount and the second predetermined amount is controlled to be 1% to 3% of a maximum flow rate that the gas flow rate control device is capable of controlling.

3. The method of claim 1, wherein flow rates of the first etching gas and the second etching gas are controlled by a gas flow rate control device, and each of the first predetermined amount and the second predetermined amount is controlled to be an amount equal to or greater than a minimum flow rate that the gas flow rate control device is capable of controlling.

4. The method of claim 1, wherein, when the first common gas or the second common gas comprises a plurality of gases, a predetermined amount of each of the plurality of gases is continuously supplied.

5. The method of claim 1, wherein the first etching gas and the second etching gas flow through a plurality of individual gas supply lines that are respectively provided according to gas species, are joined together in a common pipe connected to the plurality of individual gas supply lines, and are supplied into the processing container.

6. The method of claim 1, wherein the first etching gas and the second etching gas are alternately and repeatedly switched, whenever the first etching gas is switched to the second etching gas, the first predetermined amount of the first common gas which is needed in a process before the first switching and is not needed in a process after the first switching is supplied, and whenever the second etching gas is switched to the first etching gas, the second predetermined amount of the second common gas which is needed in a process before the second switching and is not needed in a process after the second switching is supplied.

7. The method of claim 1, wherein one of the first etching gas and the second etching gas has a deposition property stronger than a deposition property of the other.

8. An etching apparatus comprising:

a processing container;

a susceptor on which an object to be processed is held in the processing container;

a gas supply source which supplies gases;

a gas flow rate control device which controls flow rates of the gases; and a main control device, wherein the main control device is configured to control the etching apparatus such that:

the object to be processed is plasma-etched by exciting the gases in the processing container, the gas supply source supplies a first etching gas and a second etching gas used in an etching process into the processing container, in a first switching where the first etching gas is switched to the second etching gas, the gas flow rate control device controls a gas flow rate such that a first predetermined amount of a first common gas, which is needed as an etching gas in a process before the first switching and is not needed as an etching gas in a process after the first switching, is continuously supplied into the processing container, and in a second switching where the second etching gas is switched to the first etching gas, the gas flow rate control device controls a gas flow rate such that a second predetermined amount of a second common gas, which is needed as an etching gas in a process before the second switching and is not needed as an etching gas in a process after the second switching, is continuously supplied into the processing container.

* * * * *